PLANAR COAXIAL CIRCUITRY

Original Filed Feb. 4, 1965 3 Sheets-Sheet 1

INVENTORS
BRIAN E. SEAR
RAYMOND A. STEPHENS
ROBERT C. WILLIAMS
BY
Norman Pantiela

PLANAR COAXIAL CIRCUITRY

Original Filed Feb. 4, 1965 3 Sheets-Sheet 2

Fig. 3

MANUFACTURING PROCESS

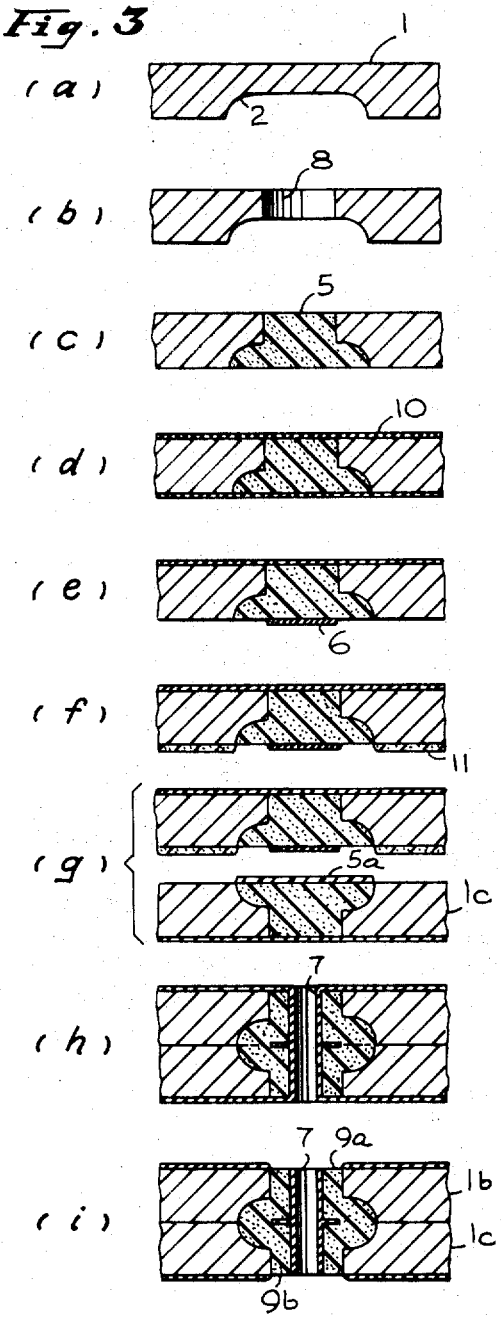

(a) AN ALUMINUM PLATE IS CHEMICALLY ETCHED TO PROVIDE A GROOVED PATTERN (b) GROUND CLEARANCE HOLES ARE DRILLED FOR ELECTRICAL THROUGH-CONNECTIONS (c) DIELECTRIC MATERIAL IS BONDED INTO GROOVES AND GROUND CLEARANCE HOLES (d) COPPER LAYERS ARE DEPOSITED OVER BOTH SURFACES (e) COPPER IS SELECTIVELY ETCHED TO LEAVE THE DESIRED CIRCUIT PATTERN (f) A CONDUCTIVE BONDING MATERIAL IS DEPOSITED ONTO METAL GROUND AREAS (g) A FILM OF DIELECTRIC ADHESIVE MATERIAL IS DEPOSITED OVER THE DIELECTRIC IN THE COVER PLATE; PLATES ARE THEN LAMINATED (h) THROUGH-CONNECTIONS ARE PROVIDED BY DRILLING AND PLATING COPPER INTO HOLES (i) COPPER IS SELECTIVELY ETCHED FROM THE DIELECTRIC SURFACES TO ELECTRICALLY ISOLATE THROUGH-CONNECTIONS FROM THE GROUND PLANES

Fig. 4

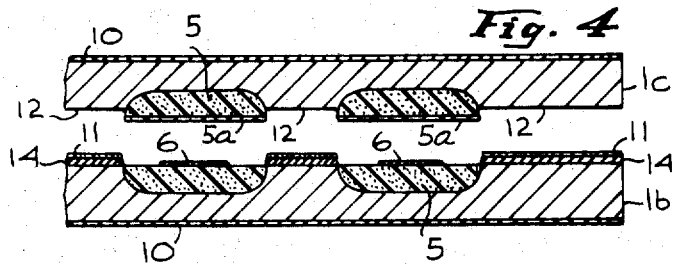

INVENTORS
BRIAN E. SEAR
RAYMOND A. STEPHENS
ROBERT C. WILLIAMS
BY
Norman Rautiola

PLANAR COAXIAL CIRCUITRY

Original Filed Feb. 4, 1965 3 Sheets-Sheet 3

INVENTORS
BRIAN E. SEAR
RAYMOND A. STEPHENS
ROBERT C. WILLIAMS
BY
Norman Rantiola United States Patent Office Re. 27,089
Reissued Mar. 23, 1971

27,089

PLANAR COAXIAL CIRCUITRY

Brian E. Sear, Woodland Hills, Calif., Raymond A. Stephens, Dallas, Tex., and Robert C. Williams, Woodland Hills, Calif., assignors to The Bunker-Ramo Corporation, Stamford, Conn.

Original No. 3,351,816, dated Nov. 7, 1967, Ser. No. 430,321, Feb. 4, 1965. Application for reissue Oct. 24, 1969, Ser. No. 869,978

Int. Cl. H01b *11/06;* H05k *1/14*

U.S. Cl. 317—101 15 Claims

Matter enclosed in heavy brackets [ ] appears in the original patent but forms no part of this reissue specification; matter printed in italics indicates the additions made by reissue.

ABSTRACT OF THE DISCLOSURE

A structure for supporting and interconnecting electrical circuit components. The structure is comprised of a stack of electrically conductive plates. Interconnections, effectively constituting coaxial transmission lines, are formed using the conductive plates as ground planes. Aligned recesses are formed in opposed surfaces of the plates. Dielectric material is disposed in the recesses with a conductive path being formed between the dielectric material filled recesses. Adjacent plates are bonded together by an electrically conductive bonding material.

This invention relates to the manufacture of electrical components and, more particularly, to a circuit panel having circuit conductors provided therein and extending to one or both surfaces thereof, and to the manufacture of such a circuit panel so as to define within the same a plurality of coaxial conductors electromagnetically isolated from one another yet having enhanced heat absorbing characteristics for dissipating the heat produced by active components conditionally held by or positioned within the circuit panel itself.

In recent years there has been an increasing emphasis on microminiaturization of electronic equipment and circuits. In the past few decades, notably since the concept of ceramic substrate printed circuits was first suggested in the 1940's for a radio proximity fuse assembly for the United States Army, substantial changes have taken place in the techniques of electronic circuit construction. Even prior to this Army work, the inventor Ducas, U.S. Patent No. 1,563,731, granted Dec. 11, 1925, described the production of circuit connections between various pieces of electrical apparatus by printing or otherwise depositing a film pattern of conductive material onto an inorganic dielectric substrate.

Today, the early ceramic printed circuit and the Ducas printed circuit, in simplified and in complex networks, are complemented by printed wiring assemblies in many permutations and variations. There are now well over 20 different commercial methods of producing printed or etched circuits, nearly all of which are based on the use of laminated plastics or ceramic materials as the insulating and supporting member. Typically, the laminated printed circuits are manufactured through a process in which a circuit pattern or network is delineated by using a photo resist on the face of a preformed insulating sheet having a metal surface bonded thereto. The portion of the metal surface which is not covered by the photo resist pattern is subsequently etched away to yield the desired conductive pattern on the insulating board surface.

These etched foil and other similar techniques are described by the pioneer Baynes in U.S. Patent No. 378,423, Feb. 28, 1888, and by D. K. Rider in Metals Progress, 74 (3); 81–85 (1958). When a ceramic substrate is desired, the conducting circuit pattern may be printed by employing techniques such as evaporation, sputtering, electro-deposition, screening, and so forth. Etching of a surface metal film can also be desirably employed, as in the manufacture of metal plated plastic boards.

While the aforementioned printed circuit techniques are improvements over the earlier method of providing insulated metal wire as a linear point-to-point connection between various circuit elements, the requirements of extremely high speed computer logic circuits and their miniaturization requires a new level of sophistication in terms of precision and tolerances which have not been susceptible of practiced realization The state of microminiaturization has been achieved where now there is as much to be gained from the development of improved and economic means for interconnecting electrical circuit components as from the employment of very small discrete components and electronic micro-circuits and functional blocks. In a present day aerospace computer, for example, interconnections represent 70% of the computer system's total volume utilizing state-of-the art printed circuit techniques discussed hereinafter.

Prior to the present invention one technique for shielding circuitry involved the use of multiple plates. The circuitry itself is then made on a central isolating circuit board having opposite first and second etched conductive surfaces. This board is then sandwiched between two other boards each comprising an insulating sheet with a conductive ground plane deposited at the outer layers. This technique brings about a measure of shielding of the circuit leads left by etching of the central board. Obviously, however, the shielding is incomplete and high signal level carrying leads have, according to this prior art technique, to be sufficiently spaced so as to reduce cross-talk to some acceptable level. According to the present invention, high level signal carrying leads are completely surrounded by a grounded structure. More particularly the present invention permits the realization of a novel circuit configuration having this characteristic but that can nonetheless be manufactured by automated techniques and does not require manual operation on individual elements. With the techniques of the invention, it is desirable to maintain certain minimum distances between the signal carrying leads and the ground structure, which depends upon the frequency and impedance requirements of the circuit. This of course will impose certain limits on the degree to which the circuitry may be miniaturized. However the degree of miniaturization possible with the technology according to the invention is not dictated by the necessity of avoiding cross-talk but solely by the single ended characteristics of each circuit taken separately. Consequently, the technique according to the present invention opens entirely new roads for the layout of circuitry, especially significant in systems having high pulse repetition rates with the attendant increased significance of the dimensional features of the circuit layout.

In accordance with the present invention there is provided a compact, efficient and inexpensive planar coaxial circuit interconnection means useful in interconnecting electronic circuits and components. Such interconnection means, in further accord with the present invention, is fabricated by techniques which lend themselves to the economical production of high precision circuitry on a commercial scale. In a preferred form of the invention, the conductive circuit paths which in part form the coaxial circuit interconnection means are defined within but electrically isolated from a self-supporting planar body, formed of a material which is characterized by high heat and electrical conductivity.

A feature of this invention is a rigid multi-board structure having accurately defined mating mirror-matched channels to receive dielectric material and a circuit pattern. This multiple cooperating board structure enables very precise spacing of the circuit relative to its metal ground planes and also enables the utilization of highly refined photographic techniques and metal removal steps which further make possible the mass production of such boards to high electrical tolerances.

As will be seen from the following description, the planar circuit interconnection means provided by the instant invention is particularly useful in satisfying the electrical requirements of the latest high-speed computer circuitry and microwave equipment, and is further characterized by a high efficiency in design, use of materials, and manufacture, to provide for the realization of improved technical performance, increased reliability, reduced costs, and ease of production.

It is therefore an object of the present invention to provide fabrication techniques for preparing multi-layered, high reliability, planar interconnection circuitry characterized by cross-talk and noise elimination in high speed circuitry, with signal transmission up to and at kilomegacycle computing rates.

It is still another object of the invention to provide a novel circuit structure characterized by compact interconnection planes making possible further miniaturization of computer equipment and reducing the complexity of interconnecting a large number of function system elements.

Another object of the present invention is to provide for high speed interconnections having well defined transmission impedances reduced electromagnetic interference problems between stages, as well as provide a structure having excellent heat dissipation properties and capable of self-support.

Other objects and advantages of the present invention will become more readily apparent from the following detailed description of the novel fabrication techniques and unique structure provided within the present invention, particularly when taken in conjunction with the appended drawings, in which.

FIG. 3 sets forth the major steps in preparing the planar coaxial circuitry.

FIG. 4 diagrammatically sets forth an embodiment showing the structural relationship between the mother board, the dielectric material, the conducting pattern disposed therewith, and a second mating board physically constructed so as to intimately receive the mother board and its circuit pattern.

Figure 5:
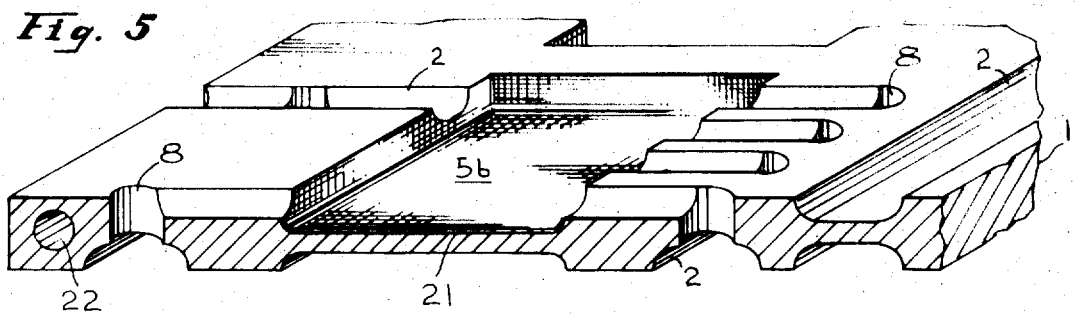

FIG. 5 illustrates the manner in which a number of integrated circuits, thin film circuits, or other microcircuit functional elements, or active and passive components, may be interconnected and mounted within the metal circuit board by employing the invention.

Figure 6:
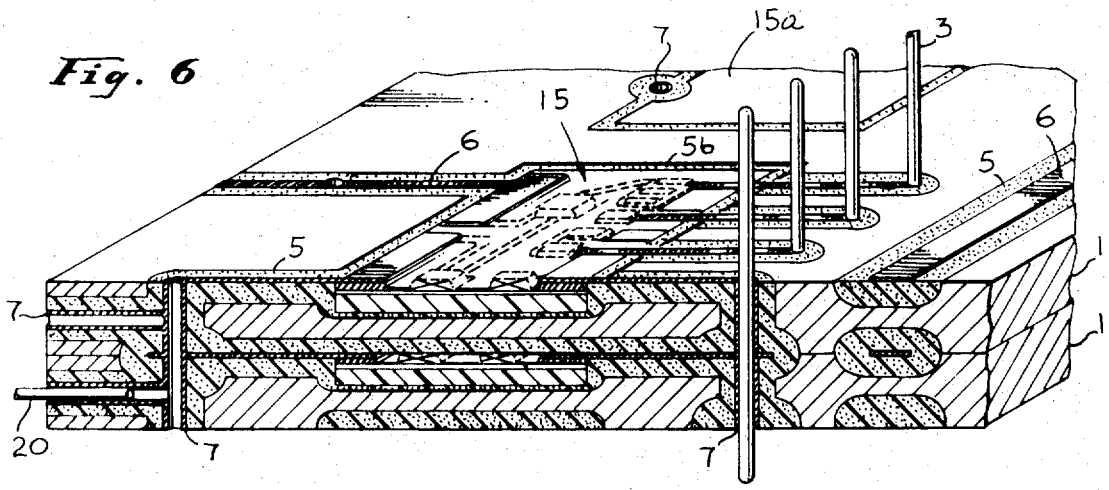

FIG. 6 is a complete functional circuit assembly with microcircuit elements containing a number of active and passive elements mounted within the multi-layered planar coaxial circuit body with appropriately shielded interconnecting paths lying completely within the metallic body.

Figure 7:
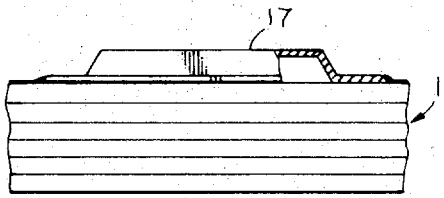

FIG. 7 shows a multi-layered stack of planar coaxial circuits, similar to FIG. 6 including microelectronic functional elements, and suitably sealed with a cover thereover.

Figure 8:
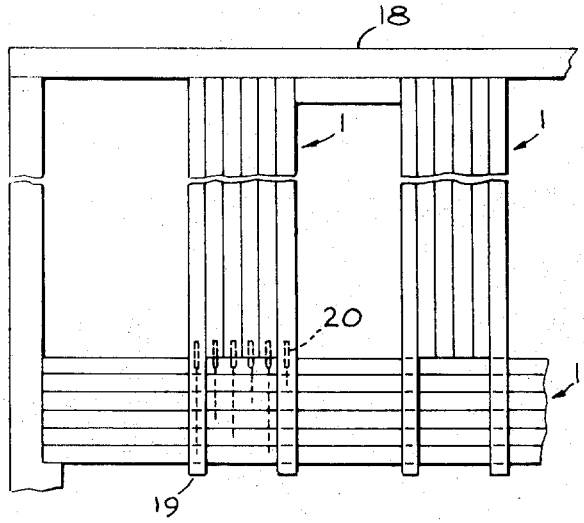

FIG. 8 depicts a number of planar coaxial circuits in stacked relationship with other like circuits disposed perpendicular thereto and electrically interconnected by pins within the shielded assemblies to provide a compact, interlocked "eggcrate" like lattice structure.

Figure 1:
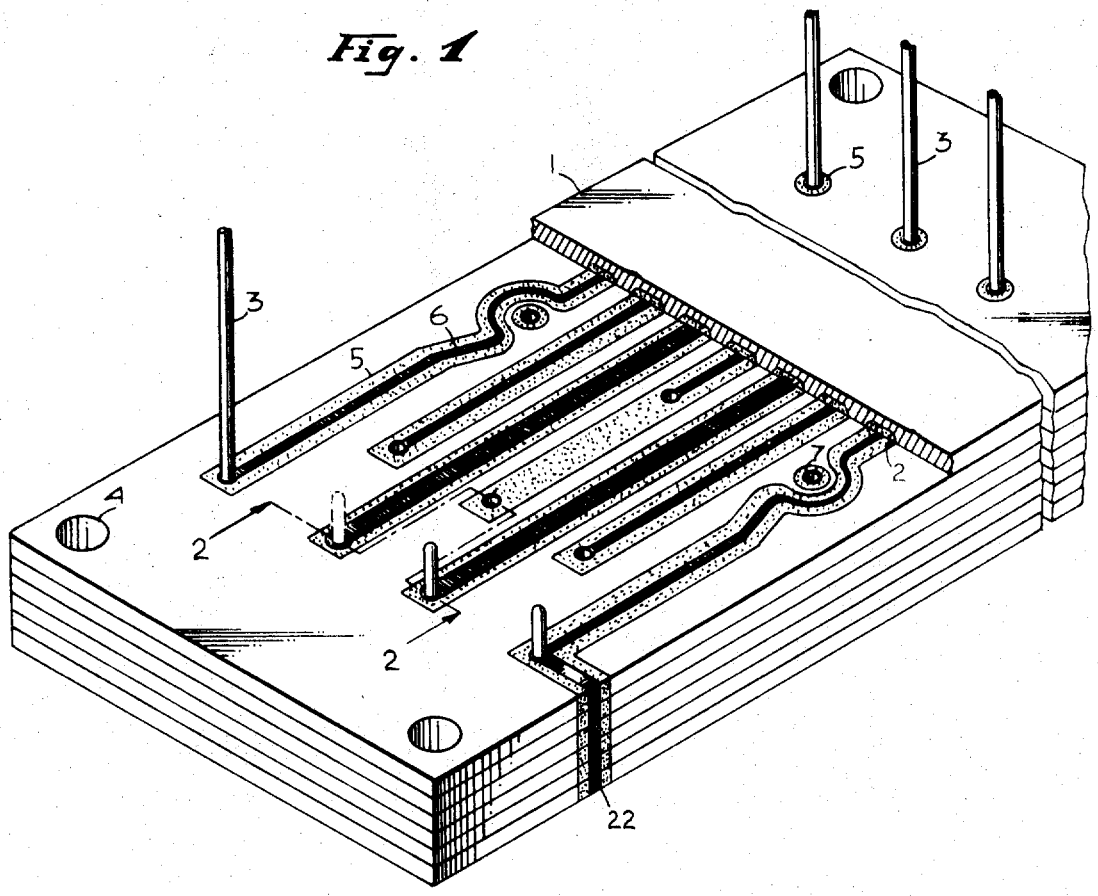
FIG. 1 illustrates the multi-layered coaxial circuit, with a portion cut away to reveal the circuit pattern disposed within the multi-layered circuit assembly.

In the practice of the present invention to minimize cross-talk, the desired circuit pattern to be defined within the planar coaxial circuit component of FIG. 1 is first selected, wherein the metal plate 1, suitably aluminum, copper, magnesium, low alloy steel, or other sheeting about 0.05" in thickness and suitably thicker for mounting components therewithin, is provided with the desired circuit pattern. The grooved patterns are preferably provided through the removal of metal, by means photochemically or electro-chemically etching to the desired size (about 30 mils deep and 80 mils wide) based on the desired electrical parameters of the final circuit. These grooves are then filled with a dielectric material 5. External connectors 3 and connector strip 22 are provided to make connection to the carefully positioned circuit pattern 6 and to other parts of the electrical apparatus. The multiple boards may be joined in the usual fashion such as by providing fasteners through the registration holes 4, and preferably are laminated together under heat and pressure to provide a permanent multi-board unitary structure.

Figure 2:
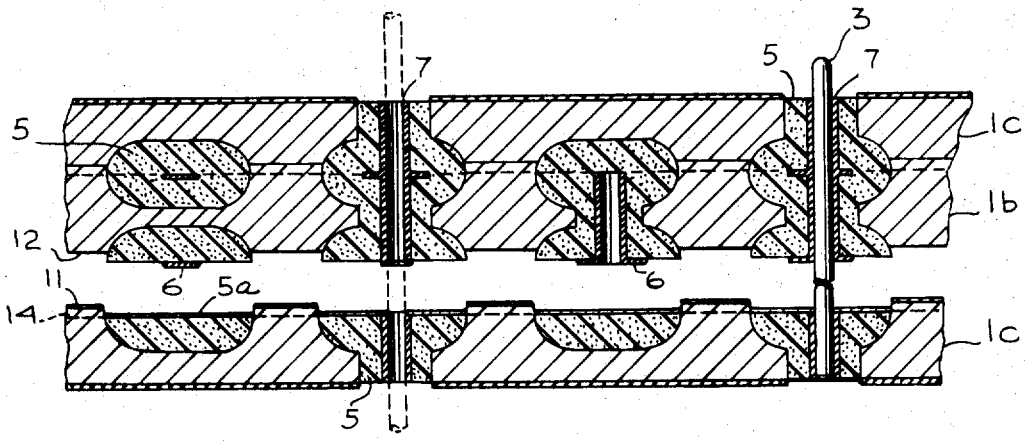
FIG. 2 is a section of a three-layered planar coaxial circuit composite.

The section view of the multi-layer circuit element shown in FIG. 2 reveals the interior design thereof. The metal base plate 1b and its cover plate 1c are provided with openings or grooves filled with a low dielectric constant material 5, which provides electrical isolation between the precisely located conducting circuit layer 6 relative to its ground planes 1b and 1c. Also shown in FIG. 2 is a through-connection 7 which is prepared by drilling through the dielectric material 5 followed by metal plating, suitably copper, various solders, silver, etc. of the walls of the hole to provide for a plated-through hole joining circuits disposed on both sides of the board. Before joining the boards together a conductive bonding agent 11 and a dielectric adhesive 5a are screened onto the mating surfaces as shown. To promote accuracy of alignment and greater circuit precision, areas 12 are provided to intimately cooperate with the raised recessed copper plated areas 14. Step areas 14 also provide adjacent circuit shielding.

In FIG. 3, there is diagrammatically set forth the manufacturing steps involved in preparing one of the circuits of the instant invention. FIG. 3(a) shows an aluminum base plate 1b having a grooved pattern 2 or channel provided therewithin. The second major step involves drilling ground clearance holes 8 for electrical through-connections as shown in FIG. 3(b), followed by introduction of a low dielectric constant material 5 into the grooves and ground clearance holes followed by heating or otherwise curing the polymeric material and causing the dielectric material to be bonded to the aluminum board. Any excess dielectric material is then removed as by lightly sanding the exposed surface of the plate so that the surface of the dielectric is coplanar with the board. In FIG. 3(d) is shown the step of depositing a copper layer 10 about 1 mil thick over both surfaces of the aluminum plate, followed by FIG. 3(e) chemical etching to selectively remove the copper from one side of the aluminum plate excepting that portion which is the desired layered conductive circuit pattern 6 which is very precisely positioned over the center portions of dielectric 5. The next step shown by FIG. 3(f) involves further copper plating of the conductor pattern to about 2 mils thickness and then providing a conductive bonding compound 11, which may be conveniently a lead-tin or any other low melting alloy solder or an epoxy loaded with metal particles, which is deposited onto the metal ground areas prior to laminating. Shown in FIG. 3(g) is the cover plate 1c having been etched to leave a mating dielectric protruding beyond the cover board surface or preferably a dielectric adhesive 5a is deposited thereover. The plates are then joined together. The next step shown in FIG. 3(h) involves the drilling of a hole into the dielectric material and through the metallic conductor areas followed by electroplating of copper 7 to the hole walls, with a subsequent selective etch treatment, shown in FIG. 3(i), to remove the copper disposed on the dielectric top 9a and bottom surfaces 9b to electrically isolate the copper through-connections 7 from the aluminum ground planes 1b and 1c. Any number of multiples of the preceding nine basic steps can be used in the production of circuits wherein a number of aluminum boards are provided in a stacked relationship.

FIG. 4 shows one of the preferred embodiments wherein portions 12 of the aluminum cover plate 1c have been removed, preferably by chemical etching between and around the epoxy-filled grooves so as to promote an intimate mating between the base board 1b and the cover board 1c by accepting layers 11 (a conductive bonding agent) and 14 (electroplated copper) therein. It has been found particularly advantageous to etch away all of the aluminum cover plate mating surface although the peripheral land areas might well remain unetched and base plate 1b unplated in the opposed cooperating surface portions.

FIG. 5 shows a self-supporting metal body 1, suitably cast or mechanically formed to provide the desired grooved circuit pattern 2 disposed within the metal body. The body also has ground clearance holes 8 appropriately drilled for electrical through-connections, and has the metal removed in selected portions thereof so as to provide cavities 21 coated with a very thin layer of heat conducting dielectric material for the mounting of functional electronic blocks or electrical components such as transistors, diodes, capacitors, magnetic or optical information storage elements, and so forth, within the body portions. Tunnels 22 may be provided for transporting fluid cooling means, such as oil, through the structure and preferentially around high heat build-up areas. They may be provided vertically or may be located at the mating surface for ease of preparation. Alternatively, the functional electronic elements 15 may be inverted and placed onto a prepared circuit pattern disposed over the thin dielectric layer 5b so that intimate electrical contact is made at the time of insertion into the cavity. Thus the element 15 electrical contacts are turned toward and physically contact a circuit pattern 6 therebelow without further wiring steps. Connections to the mounted components or functional electronic blocks are provided by the electrical through-connections 7 to the major circuit portions disposed thereinbelow.

FIG. 6 illustrates a complete electronic assembly incorporating a number of discrete monolithic, or other micro-electronic functional blocks 15, and interconnecting circuitry 6 mounted thereon and therewithin being completely shielded from adjacent portions or stages by the mother-board 1, in close heat conducting relation thereto and electrically isolated by insulating material 5b and provided with external electrical leads 3 and pin 20 leading to a power supply and other equipment. Other modifications are, of course, possible including the providing of a large number of such multiple stacks. Utilization of the instant invention makes possible the employment of relatively large area structures due to the dimensional stability and self-supporting mother-board characteristics thereof.

FIG. 7 shows a planar coaxial circuit stack, comparable to that shown in FIG. 6, but also provided with metal covering means 17 to provide for hermetic or other forms of sealing. In lieu of a metallic cover 17 the encapsulation means may desirably be a silicaceous or vitreous ceramic material overlying the microcircuit elements 15 and other circuit portions 6 detailed in FIG. 6.

FIG. 8 illustrates another method of assembling the electrical components of the instant invention to accomplish high packing densities while yet retaining the other desirable features of the invention. Electrical terminals are provided for external connection thereto and the multi-layered coaxial planar circuit is shown attached to a supporting structure 18 and is physically interconnected by board portion 19 joined to the underlying stack or suitably through fasteners. Electrical interconnections between the multiple boards in interlocked relationship are provided by pins 20 plugged into various plated-through-hole receptacles making suitable electrical connections to the desired shielded circuit patterns within each stack respectively. Other physical arrangements, such as cordwood module arrays, decked assemblies, and so forth, can also be used.

The basic process and a preferred embodiment for the production of our planar coaxial circuitry suitably involves the employment of an aluminum sheet, 1100 series, ½ hard, about 0.093″ thickness, as the starting material. In sequence, we proceed:

(1) Prepare an Al blank (base plate) by shearing to the wanted size; drill registration or tooling holes and mate to another blank of the same dimensions; one blank being for the base with the other being for covering "circuitless" portion. Provide a single master art plate.

(2) Prepare for or photo resist mask or screen application by dry sanding of blank surfaces, cold solvent degreasing, and "Iridite" treatment followed by oven drying. ("Iridite" is a proprietary name for a surface treating solution, used on aluminum, made by Allied Research Products Corporation, Baltimore, Md.)

(3) Dip or spray KMER (Kodak Metal Etch Resist, manufactured by Eastman Kodak, Rochester, N.Y.) or similar product, airless solution (4 parts resist and 5 parts thinner) at about 35 p.s.i. to blank and allow to oven-dry until tacky. Expose and develop photo resist followed by touch-up and post baking at 150° F. for 30 minutes.

(4) Chemically etch in 20 percent NaOH solution for about 2½ hours to a depth of approximately 32 mils and to a channel width of approximately 80 mils while simultaneously deoxidizing every 30 minutes and reversing blank each cycle. Subject the board to thorough cold rinsing.

(5) Provide interconnecting holes in blank by drilling to artwork pattern employing bit size of about 0.80″ diameter. Wet sand to remove KMER resist and follow up with "zincate" treatment of blank or treatment with a similar mild surface etching solution.

(6) Copper electroplating in cyanide bath of all aluminum surfaces, including channels, to an approximate 1 ml. depth. Utilize bus bar agitation; mask registration holes; and plate with current density of about 20 amps/ft.$^2$.

(7) Fill completely the troughs or channel patterns with a low dielectric constant (desirably about 2) material such as Scotchcast XR–5090, made by Minnesota Mining and Manufacturing Company, or an unmodified nonpolar polymer (polyolefins, polystyrenes, and polytetrafluoroethylene) or with a more polar polymer such as an epoxy or phenolic; pull a vacuum to insure that the channels are without voids; followed by curing at a temperature of about 150° F.

(8) Lightly sand or otherwise remove excess epoxy so that its exposed surface is substantially coplanar with the surface of the board.

(9) Electroplate copper on all aluminum surfaces to about 1 mil thickness (after masking of registration holes and zincate treatment utilizing current densities of 20 amps/ft.$^2$ with bus bar agitation of bath. Clean surfaces and follow with electroless copper deposition onto dielectric surfaces employing desirably the Shipley No. 328 mixture (made by The Shipley Company of Wellesley, Maine), with subsequent acid copper sulphate plating to about 1.5 mil depth.

(10) Apply photo resist, KPR (Kodak Photo Resist, manufactured by Eastman Kodak, Rochester, N.Y.), or equivalent product to base plate; print using composite negative/positive while exposing conductor lines and metal surfaces surrounding epoxied area.

(11) Drill conductor line pads (30 mil diameter); etch unexposed aluminum areas surrounding circuit pattern; and strip KPR resist using chemical stripers or wet fine grinding.

(12) Electroplate copper (about 2 mils) over entire aluminum surface to build a raised or "step" configuation completely surrounding the dielectric-filled groove pattern and the transmission lines plated thereon. The plating is done in an acid bath employing violent air agitation and current densities up to 40 amps/ft.$^2$.

(13) Screen onto the surfaces of the "step" or raised areas a conductive adhesive material, preferably a silver loaded epoxy.

(14) Prepare cover plates by following manufacturing steps No. 1–7 recited above to provide for opposed cooperating board(s) about .062" thick having dielectric material bonded within the grooved pattern. Use the same master art plate for mirror-image.

(15) Etch mating surface of the aluminum cover board to a 4 mil depth utilizing 20 percent NaOH solution to provide a board having a saw-tooth or step configuration with the projections being the dielectric material bonded within the board grooves.

(16) Screen onto the dielectric raised portions a film of an insulating adhesive (Minnesota Mining and Manufacturing Company's XR–9050).

The final production step involves taking the prepared base plate (having a circuit on one or both sides) and the prepared cover plate (or number of cover plates for a many-layered structure) and joining them into a unitary composite as shown in FIG. 2. Preferably the joining step involves inserting the registration pins into the plates followed by laminating in a platen press at about 50 p.s.i. pressure, a temperature of about 150° F., and curing for about 2 hours.

Various attempts have been made by workers to reduce or eliminate cross-talk in high speed logic circuits. One recent approach has been to provide a strip transmission line in a sandwich configuration comprising dual center conductors in close contact, plus two or more layers of solid dielectric sheets separating the conductors from dual ground planes. The dielectric sheets maintain a spacing between the center conductors and the ground planes. However the relationship is unprecise due to dimensional instability of the dielectric sheet material as compared to the instant invention which employs a rigid self-supporting metal board with far superior physical stability.

Coupling between closely spaced transmission lines decays exponentially with dielectric spacing, hence high packing densities can be employed with the instant planar configuration. Power handling capabilities of the instant cricuitry are much greater than heretofore due to the high heat dissipation inherent in the self-supporting metal boards, with megawatt peak powers being possible—and limited essentially only to corona or physical breakdown of the conductive pattern per se. The impedance of the transmission lines in our invention can be selected and accurately defined within a wide range of values by simply correlating dielectric conductor geometry with ground plane spacing.

In high-speed computer circuits it is useful to provide one or two logic levels per nanosecond, for example, and about 15–25 nanoseconds per memory read-regenerate cycle. A number of problems immediately arise when concerned with these speeds, including packaging densities, wiring delay (1½" interconnection—corresponds roughly to a delay of one logic level), as well as cross-talk between adjacent transmission lines and their connectors, etc. High packaging densities always raise the further problems of heat dissipation which is essential to the proper functioning of electronic equipment.

For high power electrical circuits the planar coaxial structure can be readily provided with dynamic heat removing means such as fluids flowing through tunnels in the boards 1b and 1c. Higher power handling limits for the circuitry can be realized by substituting a low-dielectric constant fluid for the solid dielectric 5 disposed within the cover plate 1c, and providing for coolant circulation by external means. This feature enables actual immersion of the transmission lines 6 into the coolant. Additional static cooling means can be provided through fins disposed over the non-mating surfaces of the cover plate 1c, and ascast metal foam or honeycomb plates can also be suitably employed.

We have satisfactorily solved for the first time these problems of signal transmission at kilomegacycle computing rates. The simplicity inherent in our invention also invites economic savings. This invention may well provide impetus for a further extension of the high speed computer state-of-the-art.

The invention as hereinabove described, and set forth in the appended drawings, is obviously capable of various modifications without departing from the inventive concept contained herein, and many apparently widely different embodiments of the same can be made within the spirit and scope of the claims without departing therefrom, and it is intended that all such matters contained in the accompanying specification shall be interpreted as illustrative only and certainly not in any limiting sense.

What is claimed is:

1. An electrical circuit comprising:

a first self-supporting electrically conducting board, said board formed with a recess in a first surface thereof;

a first mass of dielectric material disposed in the recess of said first board and bonded thereto;

a layered conductive circuit pattern contiguous with and overlying said mass of dielectric material;

a second electrically conductive board having a recess formed in a first surface thereof, said first and second boards being stacked with said first surfaces in contact with each other and with said recesses in opposed alignment to form a cavity; and a second mass of dielectric material disposed within the recess of the second board and bonded thereto, so that said circuit pattern is spaced from said first and second conductive boards but substantially enclosed in the cavity formed therewithin.

2. An electronic circuit comprising:

a first relatively flat conductive body having a recess formed on the larger surface thereof;

a second conductive body having a recess formed on the larger surface thereof;

said first and second conductive bodies joined together and conjointly defining a cavity substantially enclosed by conductive material;

the recess in said first body filled with a first solid dielectric layer; and circuit means including a layered conductor overlying said first solid dielectric layer;

the recess in said second conductive body containing a second solid dielectric layer that is disposed juxaposite said circuit means, so that said circuit means are surrounded by dielectric material and spaced in rigid spaced relationship from said first and second conductive bodies.

3. The electronic circuit of claim 2 including at least one element cavity formed in a surface of one of said bodies;

a thin layer of dielectric material disposed in said element cavity; and one or more electronic elements disposed in said element cavity electrically insulated from said bodies by said thin layer of dielectric material and electrically connected to said circuit means.

4. An electrical circuit as in claim 3 comprising:

encapsulation means overlying said electronic elements.

5. An electrical circuit as in claim 4 wherein said electronic elements comprise integrated monolithic and multichip circuits.

6. In electrical apparatus, the combination comprising:

a first electrically conductive plate having a trough in each of the upper and lower surfaces thereof, the upper trough passing over at least a portion of the lower trough spaced therefrom at a predetermined position therealong, said first plate having a hole therethrough at said predetermined position;

second and third electrically conductive plates fixed to opposite sides of said first plate, said second and third plates having troughs at the same positions as the troughs in the surfaces of said first plate adjacent thereto;

dielectric fixed in said troughs;

a first conductive strip fixed in said dielectric between said first and second plates;

a second conductive strip fixed in said dielectric between said first and third plates; and a conductor extending through said hole connecting said strips.

7. An electrical circuit structure including:

first and second electrically interconnected conductive plates supported in superposed relationship with first surfaces of said plates adjacent one another;

aligned and opposed recesses formed in said first surfaces of said first and second plates;

dielectric material disposed between said recesses; and an electrical conductor supported by said dielectric material between said recesses and electrically insulated from said conductive plates.

8. The circuit structure of claim 7 including electrically conductive material bonding together said first surfaces of said first and second plates.

9. The circuit structure of claim 7 wherein said recesses formed in said first surfaces of said first and second plates are completely filled with said dielectric material.

*10. An electrical circuit structure comprising a stack of planar members including first and second self-supporting planar members, each of said first and second planar members being conductive and having a plurality of openings therein following respective predetermined paths, dielectric material disposed in said openings, and an electrical conductor supported by the dielectric material in each opening so as to be electrically isolated from its respective conductive planar member, each conductor following a path corresponding to the path followed by its respective opening, said stack of planar members also including self-supporting planar members provided adjacent said first and second planar members and having conductive portions arranged and electrically connected thereto so as to provide complete electrical shielding for each conductor.*

*11. The invention in accordance with claim 10, wherein electrical interconnection means are included within said stack for providing an insulated electrical path passing from a predetermined conductor of said first planar member to a predetermined conductor of said second planar member.*

*12. The invention in accordance with claim 11, wherein said electrical interconnection means includes a shielded and insulated conductive material path between said predetermined conductors and perpendicular to said planar members.*

*13. The invention in accordance with claim 11, wherein said stack of planar members includes a third planar member containing electrical components, and wherein said electrical interconnection means also provide insulated electrical paths within said stack between predetermined ones of said components and predetermined ones of said conductors.*

*14. The invention in accordance with claim 13, wherein said third planar member and predetermined other planar members of said stack provide complete electrical shielding for said components as well as for each conductor.*

*15. The invention in accordance with claim 14, wherein said components are provided in the form of an electrical package having electrical outputs, wherein said third planar member is provided with insulated electrical contacts to which the electrical outputs from said package are electrically connected, and wherein said electrical connection means is provided within said stack as a plurality of insulated conductive material paths perpendicular to the planar members of the stack, and wherein predetermined ones of said planar members also provide complete electrical shielding for said insulated conductive material paths.*

References Cited

The following references, cited by the Examiner, are of record in the patented file of this patent or the original patent.

UNITED STATES PATENTS 3,234,320 2/1966 Wong.

DARRELL L. CLAY, Primary Examiner,

U.S. Cl. X.R.

174—36, 68.5